United States Patent
Geisler et al.

(10) Patent No.: US 6,350,362 B1
(45) Date of Patent: Feb. 26, 2002

(54) METHOD AND DEVICE FOR REGULATING THE CONCENTRATION OF SUBSTANCES IN ELECTROLYTES

(75) Inventors: Jens-Eric Geisler, Berlin; Ralf-Peter Wachter; Lorenz Kopp, both of Altdorf; Manfred Maurer, Heideck, all of (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/485,786

(22) PCT Filed: Aug. 19, 1998

(86) PCT No.: PCT/DE98/02505

§ 371 Date: Mar. 28, 2000

§ 102(e) Date: Mar. 28, 2000

(87) PCT Pub. No.: WO99/10564

PCT Pub. Date: Mar. 4, 1999

(30) Foreign Application Priority Data

Aug. 21, 1997 (DE) .......................................... 197 36 350

(51) Int. Cl.[7] .......................... C25D 21/18; C25B 9/00; C25B 15/12

(52) U.S. Cl. ........................... 205/101; 205/98; 205/87; 204/267; 204/269; 204/275.1; 204/232; 204/234; 204/237

(58) Field of Search .......................... 205/84, 101, 103, 205/104, 125, 292, 920; 204/269, 275.1, 276, 232–241

(56) References Cited

U.S. PATENT DOCUMENTS 6,099,711 A  * 8/2000 Dahms et al. ............... 205/101

FOREIGN PATENT DOCUMENTS

DE          215 589 A1   11/1984
DE          43 44 387 A1   6/1995

* cited by examiner

Primary Examiner—Robert Dawson
Assistant Examiner—Michael J Feely
(74) Attorney, Agent, or Firm—Paul & Paul

(57) ABSTRACT

A method and an apparatus are described for regulating the concentration of metal ions in an electrolytic fluid, which is used for the deposition of metal with insoluble anodes and additionally contains compounds of an electrochemically reversible redox system. With the oxidized form of said system, metal is dissolved in an ion generator 1, traversed by the fluid, so that these compounds are thereby reduced. For the deposition of metal, the dissolved metal ions on the item to be treated are reduced. The compounds of the redox system in the reduced form are oxidized again on the insoluble anodes in the electroplating system 13. In order to keep the concentration of the metal ions in the electrolytic fluid constant, at least a portion of the electrolytic fluid, contained in the electroplating system, is conducted through one or a plurality of electrolytic auxiliary cells 6.

16 Claims, 1 Drawing Sheet

METHOD AND DEVICE FOR REGULATING THE CONCENTRATION OF SUBSTANCES IN ELECTROLYTES

Figure 1:
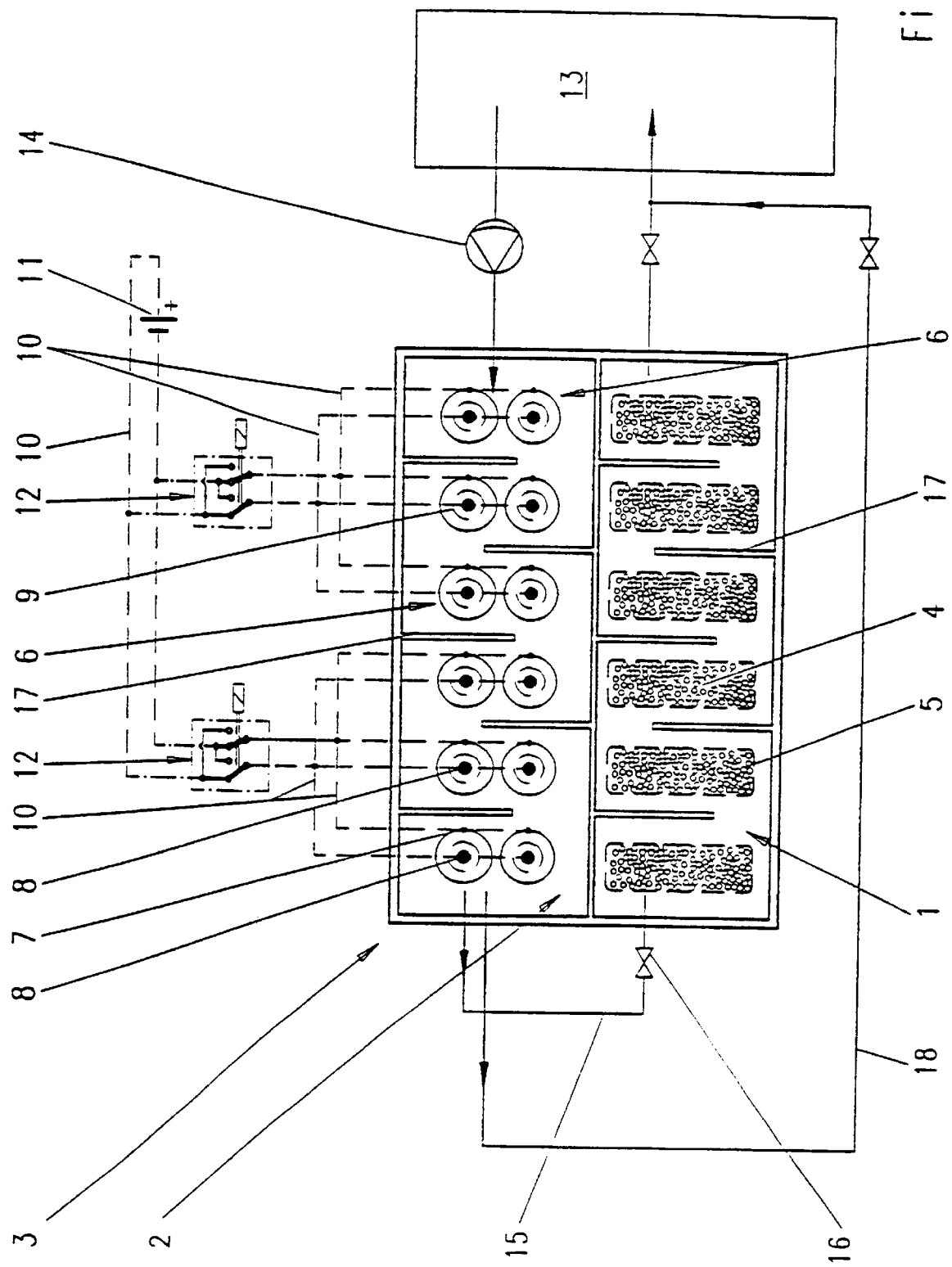

The invention relates to a method and an apparatus for regulating the concentration of substances in electrolytes for the deposition of metal. The method is preferably used for the electroplating of printed circuit boards in immersion bath systems and in horizontal or vertical continuous systems, in each case using insoluble anodes.

For the electroplating operation using insoluble anodes, it must be ensured that the metal ion concentration of the metal to be deposited is maintained in the electrolyte and remains as constant as possible. This may be achieved, for example, by supplementing the electrolyte with metal-containing salts. The costs incurred for supplying and disposing of such are very high. An alternative known method for supplementing metal ions in the electrolyte is the direct dissolution of the metal in the electrolyte by means of an oxidising agent such as oxygen. For copper-electroplating, for example, metallic copper is removed from an electrolyte, which is enriched with air oxygen. In such case, there are no residues, such as occur when supplementing with metal salts. However, during the electroplating operation in both cases, oxygen is produced on the insoluble anodes of the electrolytic cell. This oxygen attacks the organic additives of the electrolyte. It additionally causes a corrosive destruction of the anode material.

Methods for the electrolytic deposition of metal, wherein the above-mentioned problems have been solved, and wherein the metal ion concentration in the electrolyte can be kept constant without producing gas on the insoluble anodes are described in DD 215 589 A1 and DE 43 44 387 A1. Compounds of a suitable redox system are then added to the electrolyte and can be electrochemically converted into the oxidised or reduced form respectively. During the electroplating operation the compounds are oxidised on the insoluble anodes in the electrolytic cell so as to avoid gas being produced. During the reduction of the compounds in the oxidised form externally of the electrolytic cell, the metal which is situated in a container and is to be electrolytically deposited is dissolved without auxiliary power. The electrolyte, which is thus enriched with metal ions, is circulated through the electrolytic cell and through said container. In consequence, there is a constant conveyance of oxidised ions of the redox agent from the electrolytic cell into the container and a return conveyance of reduced ions of the redox agent into the electrolytic cell again. Because the metal to be deposited is dissolved in the form of ions in the container, the container is hereinafter called an ion generator.

There is considerable experience for the electrolytic copperplating of printed circuit boards from an electrolytic fluid provided with an iron addition as the redox agent. It is self-evident that the ideal case of complete oxidation of the redox agent on the insoluble anodes cannot be achieved, more especially, with the current densities in the electrolytic cell which are to be used in practice. Equally, the oxidised ions of the redox agent are reduced parasitically not only in the ion generator, but also on the cathode in the electrolytic cell in a small proportion. The consequence of this is that the cathodic current yield drops and is, therefore, only about 90 percent.

Air is constantly introduced into the electrolytic fluid by electrolyte movements so that oxygen, contained in the air, dissolves in the fluid. This oxygen is capable of dissolving copper. In consequence, the metal situated in the ion generator is dissolved in said generator, on the one hand, by reducing the oxidised form of the redox agent and, on the other hand, additionally by means of dissolved oxygen. A balance between the formation of metal ions in the solution by metal dissolution and consumption of the metal ions by electrolytic metal deposition is therefore not set. Rather, the content of the metal ions to be deposited in the electrolytic fluid increases continuously.

However, in order to ensure sufficiently good physical properties of the deposited metal, the metal ion content in the solution must be kept within narrow limits. In the described method with insoluble anodes and using compounds of a redox system, it is not possible to reduce the concentration of the metal ions in the electrolytic fluid by metal deposition in an additional electrolytic secondary cell using an insoluble anode, though such a phenomenon is known from conventional electroplating systems with soluble anodes.

In the case of electroplating systems which operate with insoluble anodes and using a redox system, the electrolytic secondary cell must also be provided with an insoluble anode. During the electroplating operation, in fact, metal works loose from the electrolyte in this secondary cell. At the same time, however, the redox agent is oxidised on the anode of the secondary cell. In consequence, the content of the oxidised ions of the redox agent increases accordingly in the electrolyte. Electrolyte, with the then existent, increased content of metal ions, passes with the electrolyte current into the ion generator. There, correspondingly more metal is electrochemically dissolved by reducing the redox agent.

In consequence, a permanent dilution of the electrolyte solution is only possible with known methods to reduce, or respectively keep constant, the metal content in the solution. For such purpose, large quantities of electrolyte must constantly be rejected and disposed of. When a continuous electroplating system has a length of six metres, approx. 500 litres electrolyte are produced every week during the three-layer operation. In addition, the rejected organic and inorganic additives of the electrolyte must also be supplemented. From economical and ecological viewpoints, this method, known as the "feed and bleed" method, is unsatisfactory.

A prerequisite for the continuous operation of an electroplating system with insoluble anodes and using a redox system in the electrolytic fluid is that a balance is set between dissolving the metal to be deposited and depositing such on the item to be treated.

In known electroplating systems, the electrolyte is conveyed to the item to be treated by means of pumps. Because of the flow movements in the electrolytic fluid, which are produced during conveyance, more especially also during the return of the electrolyte to the electroplating container over vertical paths, air is introduced into the electrolyte. In immersion systems for electroplating purposes, air injection is preferably used for circulating electrolyte. In all of these cases, air oxygen passes into the electrolyte. Considerable technical outlay is required if this introduction of oxygen is to be avoided. One possibility for solving this problem might be, for example, to cover the entire electrolytic fluid with an inert gas. For such purpose, however, the entire electroplating system, including the ion generator, would have to be encased in a gastight manner, thereby incurring considerable technical outlay.

The basic object of the invention, therefore, is to avoid the disadvantages of known methods and apparatuses and, more especially, to provide an economical method and an apparatus which are suitable, during the electrolytic metal deposition, for keeping the content of ions in the metal constant in electrolytic cells, which have insoluble anodes, and in which a depositing electrolyte is used, which contains compounds of a reversible redox system which is to be electrolytically deposited on the item to be treated.

The object is achieved by the method according to claim 1 and by the apparatus according to claim 9.

In the metal depositing method according to the invention, the metal from the electrolytic fluid is deposited on the item to be treated by using insoluble anodes. Additional compounds of an electrochemically reversible redox system are contained in the electrolytic fluid. With the oxidised form of these redox compounds, metal is dissolved in an ion generator, which is traversed by the electrolytic fluid, whereby these compounds are reduced. The reduced form of the compounds of the redox system is oxidised again on insoluble anodes. To regulate the concentration of the metal ions in the electrolytic fluid, according to the invention, a. at least a portion of the electrolytic fluid, contained in the electroplating system, is conducted through one or a plurality of electrolytic auxiliary cells, which have at least one additional insoluble anode and at least one cathode, and b. such a high electric current flow is set between the anodes and the cathodes of the auxiliary cells that the current density on the anode surface is at least 6 $A/dm^2$, preferably at least 12 $A/dm^2$ and particularly preferably at least 20 $A/dm^2$, and the current density on the cathode surface is at most 3 $A/dm^2$, preferably at most 0.5 $A/dm^2$ and particularly preferably at most 0.2 $A/dm^2$.

The apparatus according to the invention includes an electroplating system having at least one electroplating container, insoluble anodes and a power supply for depositing metal on the item to be treated, which power supply is electrically connected to the anodes and the item to be treated, and also a. at least one electrolytic auxiliary cell, each comprising
   i. at least one cathode,
   ii. at least one insoluble anode,
      iii. the ratio between the surface of the anode and the surface of the cathode being at least 1:4, preferably 1:6 or more and particularly preferably 1:10 or even more, as well as
   iv. a power supply for the auxiliary cells, which is electrically connected to the anodes and the cathodes of the auxiliary cells, and a. means, such as fluid lines and pumps, whereby a circulation of the electrolytic fluid can be produced between the auxiliary cells and the electroplating system.

The invention avoids the need for considerable technical outlay for keeping the metal ion concentration constant, in that at least a portion of the compounds of the redox system in the oxidised form in at least one electrolytic auxiliary cell, through which the electrolytic fluid of the electroplating system is conducted, is electrolytically reduced to the reduced form. In such case, these compounds are not reduced without auxiliary power, in that metal to be deposited is simultaneously dissolved. The portion of the compounds of the redox system in the oxidised stage, which is reduced in the auxiliary cells, is no longer available in the ion generator for dissolving metal without auxiliary power. In consequence, a smaller proportion of metal ions to be deposited is oxidised by the redox compounds.

By setting the current flow in the auxiliary cells, the production rate of the compounds in the reduced form, and hence subsequently the production rate of the metal ions in the ion generator, are set to a value which is so great that the quantity of metal ions produced per unit of time by oxidation with the redox compounds is exactly the same as the quantity of the metal ions consumed at the cathode in the electroplating system, plus the quantity which is produced by dissolving the metal by means of the air oxygen introduced into the electrolyte. In consequence, the entire ion content of the metal to be deposited in the electrolyte of the electroplating system remains constant. When the method according to the invention is used, therefore, the desired balance is set between the formation of metal ions and consumption thereof.

If the auxiliary cells were operated with anode and cathode potentials, such as exist in the electroplating system, metal would be deposited on the cathode of the auxiliary cell as well as in the electroplating system. The compounds of the redox system are oxidised on the anodes of the auxiliary cells. In this case, the metal ion content in the total system could not be stabilised. However, according to the invention, an unusually high anodic current density and, at the same time, an unusually low cathodic current density are set in the electrolytic auxiliary cells, so that a stabilisation of the metal ion content is achieved with a high level of efficiency. Surprisingly, very little metal or no metal is deposited on the cathode in this case. Instead, the compounds in the oxidised stage of the redox system are largely reduced on the cathode because of the then existent low cathode potential. Oxygen is produced on the anode in an electrochemical counter-reaction because of the high anode potential. The compounds in the oxidised stage of the redox system are reduced on the cathode by the auxiliary cell current. A portion of the metal is deposited at the same time. Both cases eventually lead to a reduction of the ion concentration of the metal to be deposited in the electrolyte. Only a small portion of the compounds of the redox system is still oxidised in a counter-reaction on the anodes of the auxiliary cells. Oxygen is largely formed because, as a consequence of the high current density, there is a high anode potential.

The potentials, existing at the electrodes of the auxiliary cells, determine the electrolytic processes in the cell. By fixing the ratio between the surface of the anodes and the surface of the cathodes of the auxiliary cells, the current density ratio at these electrodes is also fixed. In consequence, the current density values according to the invention can be achieved.

At a low cathode potential, which exists with a small cathodic current density such as, for example, at 0.1 $A/dm^2$ to 0.5 $A/dm^2$, little metal is deposited on the cathodes of the auxiliary cells. In this case, the compounds in the oxidised stage of the redox system are largely reduced. Since little metal is deposited on the cathodes of the auxiliary cells, little metal must subsequently be removed again from these cathodes in order to restore them to the original state. Under these conditions, a short deplating period can therefore be selected. The efficiency of the auxiliary cells is then also high, since parasitic currents, such as a deposition of metal, contribute only a small proportion of the entire cathodic current. With an increasing cathodic current density, however, the copper deposition on the cathodes of the auxiliary cells increases, and the electrolytic reduction of the compounds in the oxidised stage of the redox system decreases. Basically, higher cathodic current densities such as 3 $A/d^2$ or 10 $A/dm^2$ for example, are also suitable for reducing the metal content in the electrolyte, as is a then existent, higher potential at the cathodes. If these current densities are set, however, the efficiency of the auxiliary cell decreases, that is to say the electrical energy to be applied to reduce the compounds of the redox system in the oxidised form increases, since the proportion of metal deposition increases. Under these conditions, the outlay for deplating, or respectively maintaining, the cathodes is also greater.

The efficiency of the auxiliary cells is also affected by the potential at the anodes of the auxiliary cells. A high anode potential with a high anodic current density, such as 20 $A/dm^2$ or 60 $A/dm^2$ for example, still only produces oxygen at the anode in practice. With decreasing potential, that is to say with a decreasing anodic current density, such as 6 $A/dm^2$ for example, the compounds in the reduced stage of the redox system are also oxidised. The concentration of these compounds in the electrolyte then rises, as also does the speed of metal dissolution. This also constitutes a reduction in the efficiency of the auxiliary cells.

In practical usage, to achieve a high efficiency of the auxiliary cells and to avoid relatively long unproductive maintenance periods, a high anodic current density and a low cathodic current density are set. To set the required different current densities in the auxiliary cell, the surface of the anodes of the auxiliary cells is selected to be very large in comparison with the surface of the cathodes. The surface ratio should be at least 1:4, preferably at least 1:6 or better still at least 1:10. Ratios of at least 1:40 and, more especially, of at least 1:100 are particularly preferred. In practical usage, this is achieved by rod-like anodes, which extend into tubular cathodes. To enlarge the effective surface, the cathodes may be formed from a tubular expanded metal which, at the same time, renders possible a very good exchange of electrolyte as a consequence of the lattice structure. The material titanium is suitable therefor which, during the electrolytic deplating, is anodically passivated and therefore does not dissolve.

The anodes, which are also preferably formed from titanium, are provided on the surface with a coating of noble metal and/or a mixed metal oxide in order to reduce the excessive polarisation voltage and to keep the anodes electrically conductive and also, at the same time, to protect the anodes from electrolytic sputtering. The auxiliary cell or the auxiliary cells are supplied by at least one direct-current source. Pole reversal means, such as electric switches and/or pole reversal switches, which are operated in a time-controlled manner for example, serve to reverse the poles of the current flowing between the anodes and the cathodes of the auxiliary cells and, in consequence, permit the temporary anodic operation of the tubular cathodes. For such purpose, these means are provided in the electric connecting leads between the power supply for the auxiliary cells and the auxiliary cells. By temporarily reversing the poles of the current flowing between the anodes and the cathodes of the auxiliary cells, the slight plating of the auxiliary cell cathode is, if necessary, deplated from time to time.

In an alternative type of operation, the auxiliary cells are divided into separately electrically connected groups and cabled in groups, so that the poles of the current flowing between the anodes and the cathodes in the individual groups can be successively reversed. In this case, in one group or some groups, metal is deposited on the tubular cathodes while, in the other part of the auxiliary cells, the compounds in the oxidised stage of the redox agent are simultaneously reduced when current is applied. All of the groups are operated cathodically and anodically in succession.

Metal may also be removed again from the cathodes, in that the cathodes of the auxiliary cells in the electrolytic fluid are deplated in an electroless manner. In this case, individual groups of auxiliary cells or all of the auxiliary cells are connected in an electroless manner. The metal depositions, situated on the cathodes, are then etched electrolessly again. This corresponds to the operation in the ion generator. The deplating on the cathode is effected for cleaning purposes, and such cleaning results in additional maintenance work from time to time.

Gas, preferably oxygen, which is produced on the anodes of the auxiliary cells, may be separated from the traversing electrolyte by means of diaphragms, which are placed around the anodes and therefore situated between the anodes and the cathodes, and it may be discharged through an upper opening when the diaphragms are upwardly open. The diaphragms are formed, for example, from an upwardly open bag of fabric, preferably polypropylene fabric.

The electrolytic auxiliary cells must be traversed by the electrolyte of the electroplating system. The reduction of the redox agent is increased, more especially, by an intense flow at the cathodes of the auxiliary cells. This corresponds to an increase in the efficiency of the auxiliary cells. In a simple embodiment, the auxiliary cells are placed in the electrolyte current internally of the electroplating system. In consequence, additional containers, pipelines and pumps may be omitted. The space required for the auxiliary cells in the system and the outlay required for the reliable discharge of gas from the anodes are disadvantageous. These disadvantages are avoided by disposing the auxiliary cells in containers, which are separated from the electroplating containers of the electroplating system, and by the electrolytic fluid circulating through the electroplating containers and the auxiliary cells. The auxiliary cells may be constructed jointly in one container in combination with the ion generator and/or with electrolyte filter arrangements of the electroplating system. Furthermore in this case, means, such as pipelines and pumps, are provided for conveying the electrolytic fluid from the electroplating container through this joint arrangement.

A continuously flowing current of approx. 200 amperes is required in the auxiliary cells during constant operation in an electroplating system with a length of six metres to avoid too high a metal concentration in the electrolytic fluid. The efficiency is then 80 percent. A cathodic current density of 0.5 $A/dm^2$ corresponds to a cathode surface of 400 $dm^2$. The anodic current density of 20 $A/dm^2$ requires an anode surface of 10 $dm^2$. These surfaces are advantageously divided and accommodated in a plurality of auxiliary cells. For said system, twelve auxiliary cells with anode rods having a thickness of 10 mm and a length of 400 mm are a practicable solution. These cells are operated for between 5 and 20 percent of the time in a pole-reversed manner, that is to say the cathodes are deplated during this period.

The increase in the auxiliary cell voltage with a constant deplating current is a reference to a complete deplating of the cathodes. This may be used to control the auxiliary cells, in that, to deplate the cathodes, the poles of the current flowing between the anodes and the cathodes of the auxiliary cells are reversed and, after deplating, a current flow is set again with the original current direction when the voltage between the anodes and the cathodes has reached a predetermined increased value. As the voltage increases, a switchover to normal operation can therefore immediately be effected again. If, however, the pole reversal of the voltage is effected in a time-controlled manner, adequate reserve periods for the complete deplating of the cathodes have to be included. This reduces the capacity of the auxiliary cells. The metal, which is deposited on the anode rod during the deplating operation, is not resistant to adhesion. During normal operation, because of the powder form, it rapidly dissolves again.

In another embodiment, only some of the auxiliary cells are actually pole-reversed and operated in an electrical and deplating manner. The deplating operation is continuously switched-over to additional cells. The interval of time for the switchover is between a few minutes and some hours.

In all of the cases, the auxiliary cell current and the duration of the metal deposition in the auxiliary cells are set to be such that, in the entire electroplating system, the required balance between the metal dissolution and the metal deposition is provided, so that the metal ion content in the electrolytic fluid can be kept constant. For such purpose, the metal content has to be continuously measured. Because the change in concentration of the metal ions to be deposited in an electroplating system only occurs slowly, a manual analysis during the course of a few hours is sufficient. Corrections to the auxiliary cell current can therefore be readily effected by hand depending on the analysis.

This operation can also be automated. In this case, the concentration of the metal in the electrolytic fluid is determined with an analyser, and the current flowing between the anodes and the cathodes of the auxiliary cells is automatically set for the power supply by supplying an actual value signal of the metal ion content, determined with the analyser, to a regulator. In consequence, the reduction of the oxidised form of the redox agent is also automatically set. The desired value of the current flow is prescribed by the process data. The actual value is automatically analysed. The desired value and actual value are compared in the regulator. The auxiliary cell current is regulated by this standardising parameter and, in consequence, the ion concentration of the metal to be deposited in the electroplating system is kept constant. The content of the ions of the redox system in the electrolytic fluid is primarily affected by the auxiliary cell current. This ion content affects the dissolution quantity of the metal which is to be deposited on the item to be treated.

The lowering of the content of the oxidised substances of the redox system in the electrolyte, which is circulated from the electroplating system into the auxiliary cells, then into the ion generator and from there back again, has an additional useful effect. The item to be treated in the electroplating system is situated in an electrolytic fluid which, during the accomplishment of the method according to the invention, contains a reduced concentration of the compounds of the redox system in the oxidised stage. Correspondingly fewer compounds of the redox system are reduced by the electroplating current on the surface of the item to be treated. The consequence thereof is an improvement in the cathodic current yield in the electroplating system. The associated gain in production capacity is up to 10 percent.

An additional advantage of the invention is that the anode mud, known from electroplating systems having soluble anodes, is eliminated. Nevertheless, a "feed and bleed" operation of the electrolyte may be partially useful. This is especially the case when organic and/or inorganic additions in the electrolyte are to be exchanged over a long period. As a consequence of the partial rejection of the electrolyte, the metal content is also proportionately reduced. The capacity of the electrolytic auxiliary cells can be reduced by this proportion. In consequence, the ion content of the metal in the electrolytic fluid, which metal is to be deposited on the item to be treated, can also be kept constant by reducing compounds of the redox system in the oxidised form in the auxiliary cells and by simultaneously removing a portion of the electrolytic fluid from the electroplating container and replacing such by fresh electrolytic fluid.

The method according to the invention is particularly suitable for use in horizontal continuous systems, that is to say electroplating systems in which plate-like items to be treated, preferably printed circuit boards, are advanced linearly in a horizontal or vertical position and in a horizontal direction and thereby brought into contact with the electrolytic fluid. The method may also, of course, be used to electroplate items to be treated in conventional immersion systems, in which the item to be treated is mainly immersed in a vertical orientation. It is self-evident that the same also applies to the combination of the apparatus according to the invention with corresponding horizontal- or immersion-type electroplating systems.

The invention is explained more fully hereinafter with reference to FIG. 1.

This Figure is a plan view, by way of example, of an apparatus comprising an ion generator and the electrolytic auxiliary cells.

The ion generator 1, together with the auxiliary cell container 2, is situated in a combination container 3. The metal 4, which is to be dissolved, is stored in the ion generator and serves to supplement the metal ions, which are dissolved in the electrolytic fluid and are continuously removed from the fluid by depositing metal on the item to be treated. It is situated in baskets 5. The baskets may be formed from plastics material or from resistant metal, such as titanium, for example. The metal 4, which is to be dissolved and is in pourable form, is topped-up from above, if necessary. Electrolytic auxiliary cells 6 are situated in the auxiliary cell container 2. They comprise vertically disposed, elongate, tubular cathodes 7, which are produced from titanium expanded metal, for example. Rod-like anodes 8, which are also elongate, are situated in the centre of the cathodes 7. The anodes 8 are formed from metal, preferably from titanium, and are provided on the surface with a resistant, electrically conductive layer. The electrolytically effective surface of the cathodes 7 is at least ten times as large as the surface of the anodes 8. The diameters of the cathodes and anodes are selected accordingly. The anodes 8 are surrounded by diaphragms 9. The diaphragms are formed, for example, from a fabric which is resistant to the electrolyte. A felt of polypropylene is suitable therefor. The fabric is permeable to ions. The gas, which is produced at the anodes 8, is therefore retained. It is discharged upwardly from the electrolyte. The auxiliary cells 6 are connected to the auxiliary cell current source 11 via electric leads 10, which are shown by dashed lines. In the illustrated example, two groups of auxiliary cells are formed. A pole reversal switch 12 is inserted in each group. The pole reversal switches 12 may be electronic or electromechanical switches. These switches are actuated by manual control or by a system control, which is not shown. Such control ensures the time-controlled or potential-controlled pole reversal of the auxiliary cell groups.

The electrolyte in the symbolically illustrated electroplating system 13 is conveyed into the auxiliary cell container 2 by a pump 14. It traverses the auxiliary cells 6 here. Because of the high content of the compounds of the redox system in the oxidised stage in the electrolyte, which comes directly from the electroplating system, a correspondingly large quantity of redox agent is reduced at the cathodes of the auxiliary cells, and little metal is deposited. The electrolyte subsequently passes into the ion generator 1 via the pipeline 15 and a valve 16.

The metal to be dissolved is traversed by the electrolyte in said generator. It is thereby brought into contact with the compounds of the redox system and with the dissolved oxygen in the electrolyte. The two items effect a dissolution of the metal contained in the ion generator. To intensify the contact with the metal in the baskets 5, the electrolyte may be conducted through the ion generator 1 in a serpentine-like manner around obstacles 17.

The electrolyte passes from the ion generator 1 back into the electroplating system 13. The spacing between the combination container 3 and the electroplating system 13 should be as small as possible.

An additional pipe 18 with an additional valve is also illustrated in the Figure. This pipe, with a corresponding control for the valves, permits the ion generator to be temporarily bypassed, for example in the event of maintenance work. Other pipes and dispositions of the containers are possible. However, they are not essential to the invention. In consequence, the electrolyte may also be conveyed from the electroplating system 13 initially into the ion generator 1 and from there only into the auxiliary cell container 2. In this case, the metal dissolution is more intensive because of a greater concentration of the compounds of the redox system in the oxidised stage. The ion generator may therefore have a smaller construction in terms of space. However, the efficiency of the auxiliary cells in this electrolyte embodiment is reduced.

In an alternative embodiment of the invention, the ion generator 1 and/or the auxiliary cells 6 are incorporated in the electroplating system 13. The costs for the combination container 3 are eliminated in this case.

All of the disclosed features and combinations of the disclosed features are the subject-matter of this invention, provided that they have not explicitly been stated as being known.

LIST OF REFERENCE NUMERALS

1 ion generator
2 auxiliary cell container
3 combination container
4 metal to be dissolved
5 baskets
6 auxiliary cell
7 cathode
8 anode
9 diaphragm
10 electric lead
11 auxiliary cell current source
12 pole reversal switch
13 electroplating system
14 pump
15 pipeline
16 valve
17 obstacle
18 pipe

What is claimed is:

1. Method of regulating the concentration of metal ions in an electrolytic fluid, which is used for the deposition of metal and additionally contains compounds of an electrochemically reversible redox system, metal being dissolved with the oxidized form of said compounds in an ion generator, traversed by the electrolytic fluid, so that the compounds in the oxidized form are thereby reduced, the resultant compounds in the reduced form also being oxidized again on insoluble anodes, and the metal from the electrolytic fluid, which is situated in at least one electroplating container of an electroplating system, being deposited on an item to be treated by using the insoluble anodes, characterized in that a. at least a portion of the electrolytic fluid, contained in the electroplating system (13), is conducted through one or a plurality of electrolytic auxiliary cells (6), which have at least one insoluble anode (8) and at least one cathode (7), and b. such a high electric current flow is set between the anodes (8) and the cathodes (7) of the auxiliary cells (6) that the current density on the anode surface is at least 6 A/dm$^2$, and the current density on the cathode surface is at most 3 A/dm$^2$.

2. Method according to claim 1, characterized in that the auxiliary cells (6) are disposed separately from the electroplating container, and in that the electrolytic fluid is circulated through the electroplating containers and the auxiliary cells (6).

3. Method according to claim 1 or 2, characterized in that the poles of the electric current flowing between the anodes (8) and the cathodes (7) of the auxiliary cells (6) are temporarily reversed.

4. Method according to claim 1 or 2, characterized in that the auxiliary cells (6) are divided into separately electrically connected groups, and the poles of the electric current flowing between the anodes (8) and the cathodes (7) of the auxiliary cells (6) are reversed in succession in the individual groups.

5. Method according to claim 1 or 2, characterized in that the electric current flowing in the auxiliary cells (6) is so set that the content of the metal ions in the electrolytic fluid is kept constant.

6. Method according to claim 1 or 2, characterized in that the poles of the electric current flowing between the anodes (8) and the cathodes (7) of the auxiliary cells (6) are reversed for deplating the cathodes (7), and the electric current flow is then set again with the original current direction when the voltage between the anodes (8) and the cathodes (7) of the auxiliary cells (6) has reached a predetermined value.

7. Method according to claim 1 or 2, characterized in that the cathodes (7) of the auxiliary cells (6) are deplated in the electrolytic fluid electrolessly.

8. Method according to claims 1 or 2, characterized in that the content of the metal ions in the electrolytic fluid is kept constant by reducing the compounds of the redox system in the oxidized form in the auxiliary cells (6) and by simultaneously removing a portion of the electrolytic fluid from the electroplating container and replacing such by fresh electrolytic fluid.

9. Apparatus for regulating the concentration of metal ions in an electrolytic fluid, which is used for the deposition of metal, on an item to be treated in at least one electroplating container of an electroplating system, the electroplating system including insoluble anodes and a power supply, which is electrically connected to the anodes and the item to be treated, characterized by a. at least one electrolytic auxiliary cell (6), each comprising
  i. at least one cathode (7),
  ii. at least one insoluble anode (8),
  iii. the ratio between the surface of the anodes (8) and the surface of the cathodes (7) being at least 1:4, and
  iv. a power supply (11) for the auxiliary cells (6), which is electrically connected to the anodes (8) and the cathodes (7) of the auxiliary cells (6), as well as b. means (14;15;16), whereby a circulation of the electrolytic fluid can be produced between the auxiliary cells (6) and the electroplating system (13).

10. Apparatus according to claim 9, characterized in that the insoluble anodes (8) of the auxiliary cells (6) are provided with a coating which is substantially formed from noble metal and/or a mixed metal oxide coating.

11. Apparatus according to claim 9 or 10, characterized in that the cathodes (7) of the auxiliary cells (6) have a tubular configuration and are formed from expanded metal.

12. Apparatus according to claim 9 or 10, characterized in that diaphragms (9), which are upwardly open and formed from a fabric, are disposed between the anodes (8) and the cathodes (7) of the auxiliary cells (6).

13. Apparatus according to claim 9 or 10, characterized in that the auxiliary cells (6), an ion generator (1) which serves to form metal ions in the electrolytic fluid by dissolving metal by means of compounds of a reversible redox system, and/or electrolyte filter arrangements are jointly disposed in one container, and in that means (14) are provided for conveying the electrolytic fluid from the electroplating container through the entire arrangement (3).

14. Apparatus according to claim 9 or 10, characterized in that, to reverse the poles of the current flowing between the anodes (8) and the cathodes (7) of the auxiliary cells (6), electric switches and/or pole reversal switches (12) are provided in the electric connecting leads (10) between the power supply (11) for the auxiliary cells (6) and the auxiliary cells (6).

15. Apparatus according to claim 9 or 10, characterized in that an analyzer is provided for determining the metal ion content in the electrolytic fluid.

16. Apparatus according to claim 15, characterized in that, to regulate the current flowing between the anodes (8) and the cathodes (7) of the auxiliary cells (6), a means is provided for supplying an actual value signal of the metal ion content, determined with the analyzer, to a regulator for the power supply.

* * * * *